(12) United States Patent
Razin

(10) Patent No.: US 11,093,664 B2
(45) Date of Patent: Aug. 17, 2021

(54) METHOD AND APPARATUS FOR CONVERGED ANALYSIS OF APPLICATION, VIRTUALIZATION, AND CLOUD INFRASTRUCTURE RESOURCES USING GRAPH THEORY AND STATISTICAL CLASSIFICATION

(71) Applicant: SIOS Technology Corporation, Lexington, SC (US)

(72) Inventor: Sergey A. Razin, Columbia, SC (US)

(73) Assignee: SIOS Technology Corp., Lexington, SC (US)

(*) Notice: Subject to any disclaimer, the term of this patent is extended or adjusted under 35 U.S.C. 154(b) by 559 days.

(21) Appl. No.: 14/813,512

(22) Filed: Jul. 30, 2015

(65) Prior Publication Data
US 2016/0188767 A1 Jun. 30, 2016

Related U.S. Application Data

(60) Provisional application No. 62/030,668, filed on Jul. 30, 2014.

(51) Int. Cl.
*G06F 30/18* (2020.01)
*G06N 5/00* (2006.01)
(Continued)

(52) U.S. Cl.
CPC ............ *G06F 30/18* (2020.01); *G06F 9/5066* (2013.01); *G06N 5/00* (2013.01); *H04L 43/065* (2013.01)

(58) Field of Classification Search
CPC ..... H04L 41/145; H04L 41/12; H04L 41/147; H04L 41/0893; H04L 63/20; H04L 45/02;
(Continued)

(56) References Cited

U.S. PATENT DOCUMENTS 5,461,698 A * 10/1995 Schwanke ................ G06N 3/04
706/20
6,480,814 B1 * 11/2002 Levitan .................. G06N 3/126
703/2
(Continued)

FOREIGN PATENT DOCUMENTS

JP 2007157131 A 6/2007
JP 2010231420 A 10/2010
(Continued)

OTHER PUBLICATIONS

Espin et al. A Multi-tenancy Model Based on Resource Capabilities and Ownership for Infrastructure Management IEEE 4th International conference on Cloud Computing Technology and Science, 2012, pp. 682-686.*
(Continued)

*Primary Examiner* — Rehana Perveen
*Assistant Examiner* — Cuong V Luu
(74) *Attorney, Agent, or Firm* — Duquette Law Group, LLC

(57) ABSTRACT

Embodiments of the innovation relate to a method and apparatus for utilizing graph theory and clustering analysis to build relationships among applications and corresponding and/or dependent virtualization, cloud and datacenter infrastructure components and to derive the definition of application boundaries and corresponding infrastructure components. This allows a system administrator to manage and address complex issues within a computer infrastructure, such as availability, service level deliverable/guarantees, performance, and resource optimization.

17 Claims, 10 Drawing Sheets

(51) Int. Cl.
*G06F 9/50* (2006.01)
*H04L 12/26* (2006.01)

(58) Field of Classification Search
CPC ... H04L 41/0213; H04L 67/42; H04L 43/045;
H04L 41/046; H04L 41/08; H04L
43/0811; H04L 45/48; H04L 41/024;
H04L 47/41; H04L 47/822; H04L 63/104;
G06N 3/04
See application file for complete search history.

(56) References Cited

U.S. PATENT DOCUMENTS

| | | | | |
|---|---|---|---|---|
| 6,684,255 | B1* | 1/2004 | Martin | G06T 15/40 345/419 |
| 7,747,648 | B1* | 6/2010 | Kraft | G06F 16/288 707/790 |
| 8,014,371 | B1* | 9/2011 | Miller | H04W 40/24 370/255 |
| 8,046,835 | B2* | 10/2011 | Herz | G06Q 20/201 726/25 |
| 8,595,262 | B1* | 11/2013 | Hayden | G06F 16/2471 707/798 |
| 8,881,288 | B1* | 11/2014 | Levy | G06F 21/577 709/225 |
| 9,215,158 | B1* | 12/2015 | Adogla | H04L 29/08144 |
| 2003/0046390 | A1* | 3/2003 | Ball | H04L 41/12 709/224 |
| 2004/0054690 | A1* | 3/2004 | Hillerbrand | G06Q 10/06 |
| 2004/0133531 | A1* | 7/2004 | Chen | G06K 9/6298 706/8 |
| 2005/0021742 | A1 | 1/2005 | Yemini et al. | |
| 2006/0025985 | A1* | 2/2006 | Vinberg | G06F 8/65 703/22 |
| 2006/0083231 | A1* | 4/2006 | Jeffay | H04L 43/026 370/389 |
| 2007/0136788 | A1* | 6/2007 | Monahan | H04L 63/20 726/3 |
| 2007/0220451 | A1* | 9/2007 | Arnone | H04L 41/12 716/100 |
| 2007/0266369 | A1* | 11/2007 | Guan | H04L 41/0226 717/116 |
| 2008/0306798 | A1* | 12/2008 | Anke | G06F 8/61 705/7.26 |
| 2009/0171731 | A1* | 7/2009 | Bobak | G06Q 10/06 705/7.23 |
| 2009/0296719 | A1* | 12/2009 | Maier | H04L 45/12 370/400 |
| 2009/0300173 | A1* | 12/2009 | Bakman | G06F 11/008 709/224 |
| 2010/0229150 | A1* | 9/2010 | Stone | G06F 8/00 717/104 |
| 2013/0060632 | A1* | 3/2013 | Gadhia | G06Q 30/0251 705/14.53 |
| 2013/0139164 | A1 | 5/2013 | Balko | |
| 2013/0185644 | A1* | 7/2013 | Kitano | H04L 41/22 715/736 |
| 2014/0032553 | A1* | 1/2014 | Chu | G06F 16/283 707/737 |
| 2014/0279306 | A1* | 9/2014 | Shi | G06Q 40/12 705/30 |
| 2014/0304214 | A1* | 10/2014 | Sakunkoo | G06F 16/367 706/55 |
| 2014/0351649 | A1* | 11/2014 | Madani | G06F 11/079 714/37 |
| 2015/0195296 | A1* | 7/2015 | Vasseur | H04L 43/0876 726/23 |
| 2016/0283304 | A1* | 9/2016 | Horikawa | G06F 11/3409 |

FOREIGN PATENT DOCUMENTS

| | | |
|---|---|---|
| JP | 2011159125 A | 8/2011 |
| JP | 2011258098 A | 12/2011 |
| JP | 2014096166 A | 5/2014 |

OTHER PUBLICATIONS

Hwang et al. Topology Discovery & Service Classification for Distributed-Aware Clouds IEEE International Conference on Cloud Engineering, 2014, pp. 385-390.*
Bales et al. Graph Theoretic Mmodeling of Large-Scale Semantic Networks Journal of Biomedical Informatics 39, 2006, pp. 451-464.*
Dekker et al. Network Robustness and Graph Topology 27th Australasian Computer Science Conference, 2004, pp. 359-368.*
Maarten van Steen An Introduction to Graph Theory and Complex Networks Jan. 2010.*
International Search Report dated Nov. 19, 2015 from corresponding International Application No. PCT/US15/042844.

* cited by examiner

METHOD AND APPARATUS FOR CONVERGED ANALYSIS OF APPLICATION, VIRTUALIZATION, AND CLOUD INFRASTRUCTURE RESOURCES USING GRAPH THEORY AND STATISTICAL CLASSIFICATION

RELATED APPLICATIONS

This patent application claims the benefit of U.S. Provisional Application No. 62/030,668, filed on Jul. 30, 2014, entitled, "Method and Apparatus for Converged Analysis of Application, Virtualization, and Cloud Infrastructure Resources Using Graph Theory, Clustering, and Classification," the contents and teachings of which are hereby incorporated by reference in their entirety.

BACKGROUND

Modern economies and business services typically run complex, dynamic, and heterogeneous Information Technology (IT) computer infrastructures. For example, computer infrastructures can include one or more servers or host devices and one or more storage arrays interconnected by communication devices, such as switches or routers. The servers can be configured to execute one or more virtual machines (VMs) during operation. Each VM can be configured to execute or run one or more applications or workloads.

In conventional, non-virtualized computer infrastructure environments, the host device executes an operating system (OS), which, in turn, executes a number of processes that deliver a workload. In these conventional environments, the number of objects associated with the servers, operating systems, and processes, as well as their locations are substantially static. With introduction of virtualization and cloud infrastructure resources, each layer is capable of having a virtualized and shared component. For example, with reference to FIG. 1, a computer infrastructure 5 includes infrastructure 5-1, 5-2, and 5-3 having multiple interconnected components (e.g., host devices, storage arrays, VMs, etc.). Additionally, each of the infrastructures 5-1, 5-2, and 5-3 are disposed in electrical communication with each other and are configured to share primitives resources. For example, the location of these resources can be considered dynamic, as workload can migrate between hosts and connected components, datacenters (e.g., data stores), and cloud providers (e.g., virtual networks).

SUMMARY

The management of virtualized computer infrastructures has become complicated due, in part, to the deployment of rapidly growing cloud and virtualization that expose core functionality on top of the primitives of the infrastructure (i.e. commodity hardware). Further, the adoption of next generation of distributed applications with limitless scalability and availability also complicates the management of virtualized computer infrastructures. Accordingly, while the above-mentioned sets of technologies introduce flexibility and agility into the computer infrastructure, these technologies introduce relatively large complexities with respect to the operation of the technologies as performed by a human agent (i.e., Virtualization/Cloud Architects and/or system administrators).

The application of virtualized computer technologies to an infrastructure can affect the delivery of guaranteed/desired service levels, including availability, performance, and security in these dynamic environments. For example, the large increase in the number of objects requires management/configuration, analysis, and an understanding of the relationships among the objects. Further, the events that take place in those dynamic and agile environments on a substantially constant basis (i.e., new objects and behaviors introduced, resource moved around, resources failing and/or causing the contention of the resource, etc.) and the ability to correlate the events with the related resources/objects affect the ability of a system administrator to determine the accurate impact of such events to the infrastructure.

Both of these contributors can limit or prevent effective management and delivery of the guaranteed/desired service levels (including availability), performance, and security in the computer infrastructures. For example, with the growing amounts of data utilized by a computer system, the workloads, and the changes in the definition of a workload, it can be difficult for a system administrator to have a clear understanding of the workload, its requirements, and effects on a given infrastructure.

Without insight into the environment, which includes visibility into the objects (e.g., including resources and events), relationships, corresponding statistical data, and the ability to understand the behavior of the workload as well as the effects of it on the underlying layers of the infrastructure, it is difficult to deliver guaranteed service levels (e.g., including availability), performance, and security of the environment. Further, it is difficult for a systems administrator to perform effective root cause analysis and determine all possible relationships (especially with changing trend in workload distribution) and permutations of such that exist (or do not exist where such should) in such complex virtualization and cloud environments.

Embodiments of the present innovation relate to a method and apparatus for converged analysis of application, virtualization, and cloud infrastructure resources using graph theory and statistical classification. In one arrangement, a host device is configured to develop a model of the hierarchies, relationships, and groups of objects representing various computer environment resources, within a computer infrastructure, utilizing graph theory. Such modeling allows the host device to deliver actionable insights about the computer infrastructure and allows a system administrator to ask different types of questions about the environment. The host device is further configured to utilize a clustering function to dynamically categorize and group the objects (e.g., resources and events) based on different types of metadata associated with the objects. This encapsulates the behavioral understanding of one object as well as groups of objects connected through relationships and/or group for the system administrator to understand the behavior of the computer infrastructure.

By modeling a computer infrastructure using graph theory and clustering analysis, the host device is configured to provide a system administrator with the ability to effectively manage a computer infrastructure in the circumstances of normal operations, such as during day-to-day maintenance, and to understand the effects of various aspects of the infrastructure on capacity planning, security evaluation/monitoring of the environment, availability, service level deliverable/guarantees, performance (e.g., bottleneck analysis) and resource optimization. Additionally, based upon utilization of clustering analysis, the host device allows the system administrator to perform the root cause analysis (RCA) relative to the computer infrastructure, which is difficult with the conventional systems that store and present the infrastructure in a flat structure.

In one arrangement, embodiments of the innovation relate to, in a host device, a method for generating a computer infrastructure model of a computer infrastructure. The method includes receiving, by the host device, a set of objects from a computer infrastructure, each object of the set of objects relating to an attribute of a computer infrastructure resource of the computer infrastructure and each object of the set of objects having an object identifier criterion, an object relationship criterion, and an object specific criterion. The method includes defining, by the host device, each object as a node of the computer infrastructure model based upon the respective object identifier criterion and defining, by the host device, a set of edges among the nodes of the computer infrastructure model based upon the object relationship criterion of each object, each edge of the set of edges configured as an explicit relationship between two objects of the set of objects. The method includes defining, by the host device, a set of implicit relationships among the nodes of the computer infrastructure model based upon the object specific criterion.

BRIEF DESCRIPTION OF THE DRAWINGS

The foregoing and other objects, features and advantages will be apparent from the following description of particular embodiments of the innovation, as illustrated in the accompanying drawings in which like reference characters refer to the same parts throughout the different views. The drawings are not necessarily to scale, emphasis instead being placed upon illustrating the principles of various embodiments of the innovation.

DETAILED DESCRIPTION

Embodiments of the present innovation relate to a method and apparatus for converged analysis of application, virtualization, and cloud infrastructure resources using graph theory and statistical classification. In one arrangement, a host device is configured to develop a model of the hierarchies, relationships, and groups of objects representing various computer environment resources, within a computer infrastructure, utilizing graph theory. Such modeling allows the host device to deliver actionable insights about the computer infrastructure and allows a system administrator to ask different types of questions about the environment. The host device is further configured to utilize a clustering function to dynamically categorize and group the objects (e.g., resources and events) based on different types of metadata associated with the objects. This captures the behavioral understanding of one object as well as groups of objects connected through relationships and/or groups for the system administrator to effectively manage the dynamic computer infrastructure.

By modeling a computer infrastructure using graph theory and clustering analysis, a host device is configured to provide a system administrator with the ability to effectively manage a computer infrastructure in the circumstances of normal operations, such as during day-to-day maintenance. Further the host device allows the system administrator to understand of effects of various aspects of the infrastructure on capacity planning, security evaluation/monitoring of the environment, availability, service level deliverable/guarantees, performance (e.g., bottleneck analysis) and resource optimization. Additionally, based upon utilization of clustering analysis, the host device allows the system administrator to perform the root cause analysis (RCA) relative to the computer infrastructure, which is difficult with the conventional systems that store and present the infrastructure in a flat structure.

Figure 1:
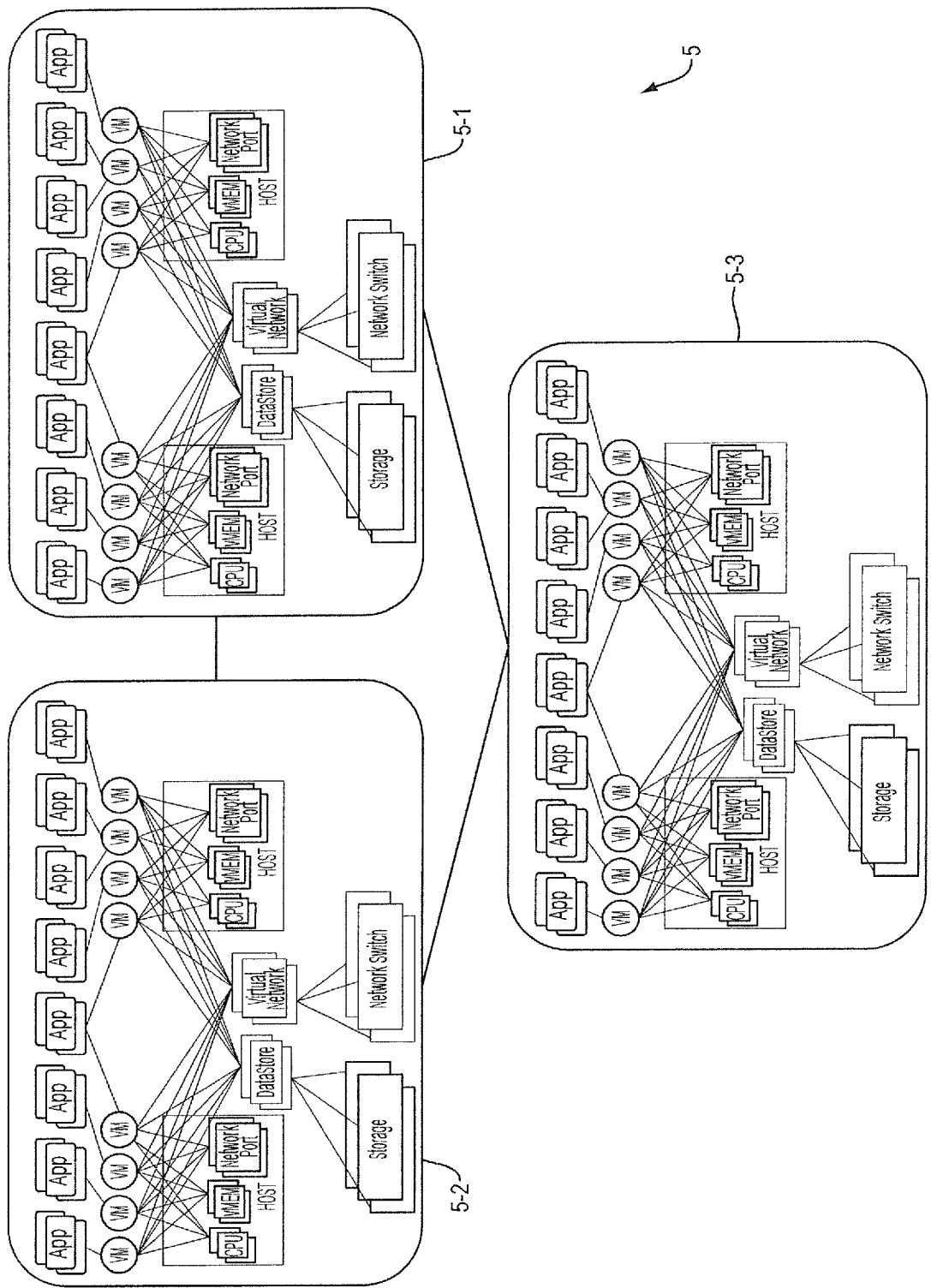
FIG. 1 illustrates a prior art arrangement of computer infrastructures sharing primitives resources.
Figure 2:
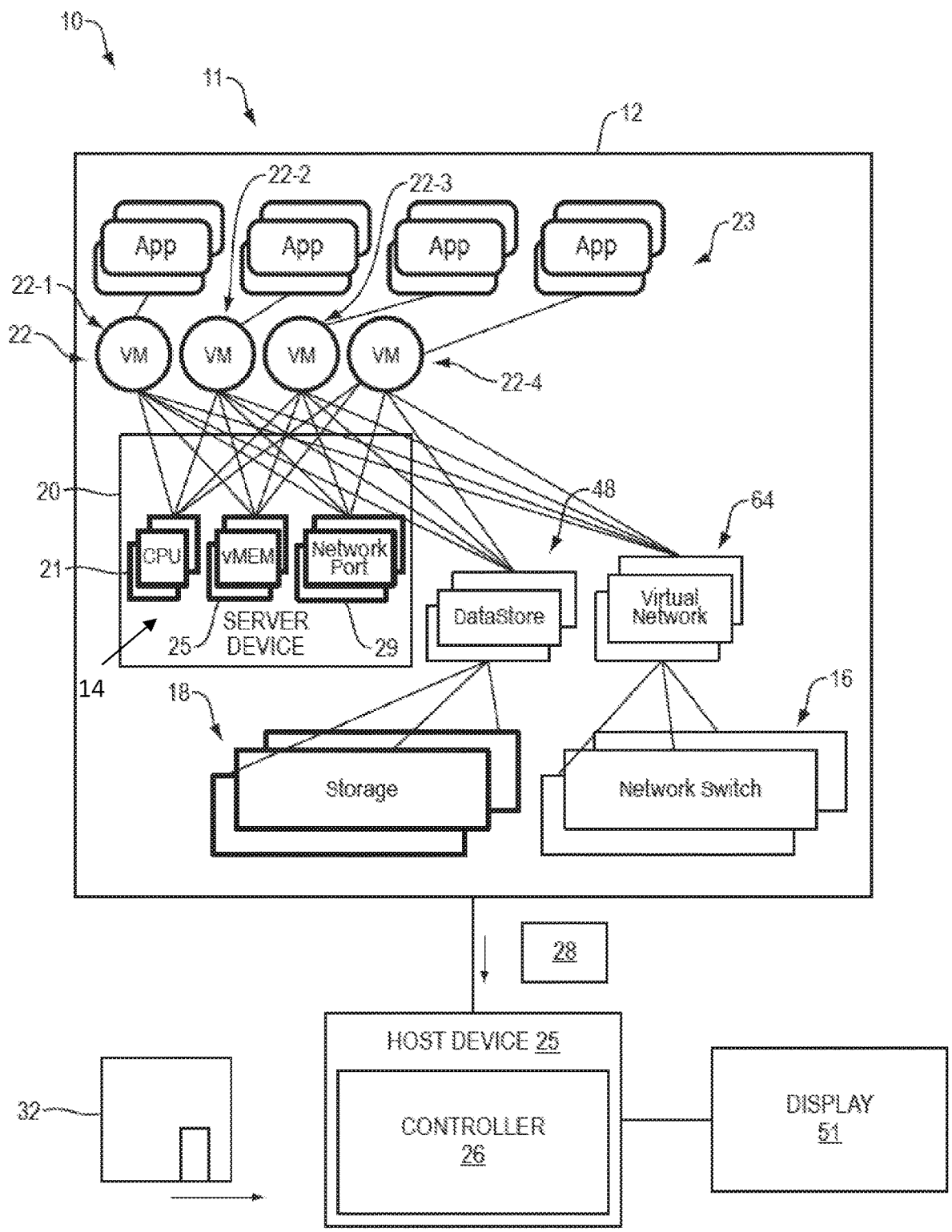
FIG. 2 illustrates a computer infrastructure, according to one arrangement.

FIG. 2 illustrates an arrangement of a computer environment 10 which includes at least one computer infrastructure 11 disposed in electrical communication with a host device 25. While a single computer infrastructure 11 is illustrated, it should be understood that the host device 25 can be disposed in electrical communication with any number of computer infrastructures 11. Further, while the computer infrastructure 11 can be configured in a variety of ways, in one arrangement, the computer infrastructure 11 includes a variety of computer environment resources 12. For example, the computer environment resources 12 can include one or more server devices 20, such as computerized devices, one or more communication devices 16, such as switches or routers, and one or more storage devices 18, such as disc drives or flash drives, one or more data stores 48, such as a database, and one or more virtual networks 64.

Each server device 20 can include a controller or compute hardware 14, such as a memory 25 (e.g., virtual memory) and processor (e.g., CPU) 21, and a communications port 29. Each controller 14 can be configured to execute one or more virtual machines 22 where, in one arrangement, each virtual machine 22 is configured to execute or run one or more applications or workloads 23. For example, controller 14 can execute a first virtual machine 22-1, a second virtual machine 22-2, a third virtual machine 22-3, and a fourth virtual machine 22-4 each of which, in turn, is configured to execute one or more workloads 23. Each controller element 14, storage device element 18, network communication device element 16, and application 23 relates to an attribute of the computer infrastructure 11. For example, attributes of the computer infrastructure 11 include application attributes, compute attributes such as virtual machine (VM) attributes, storage attributes, and network attributes.

In one arrangement, the host device 25 is configured as a computerized device having a controller 26, such as a memory and a processor. The host device 25 is disposed in electrical communication with the computer infrastructure 11 and with a display 53. The host device 25 is configured to receive, via a communications port (not shown), a set of data elements 28, such as objects, from the computer environment resources 12. The host device 25 is further configured to model and derive the complex relationships associated with objects 28 of the computer infrastructure resources 12. Such modeling and derivation provides a system administrator with a substantially comprehensive view into the hierarchies of the multi-layered infrastructure resources 12 and allows the administrator to deliver a converged view model of the infrastructure 11, even as the attributes of the infrastructure 11 change over time.

The controller 26 of the host device 25 can store an application for analyzing application, virtualization, and cloud infrastructure resources using graph theory, clustering, and classification. The analytics application installs on the controller 26 from a computer program product 32. In some arrangements, the computer program product 32 is available in a standard off-the-shelf form such as a shrink wrap package (e.g., CD-ROMs, diskettes, tapes, etc.). In other arrangements, the computer program product 32 is available in a different form, such downloadable online media. When performed on the controller 26 of the host device 25, the analytics application causes the host device 25 to model the hierarchies, relationships, and groups of objects, which represent the various computer environment resources 12 within computer infrastructure 11, using graph theory. Further, when performed on the controller 26 of the host device 25, the analytics application causes the host device 25 to dynamically categorize and group the objects (e.g., resources and events) based on different types of metadata associated with the objects using a clustering function.

As indicated above, virtualization and cloud infrastructure relationships have become relatively complex as there are many direct and indirect connections, as well as known and unknown connections, that exist among the computer infrastructure resources 12 of a computer infrastructure 10. The host device 25 is configured to leverage the principals of graph theory, via a graph theory function 100, and apply such to the virtualization and cloud infrastructure to define the interrelationships of the computer infrastructure resources 12 to define a computer infrastructure model of the computer infrastructure 11.

Figure 4:
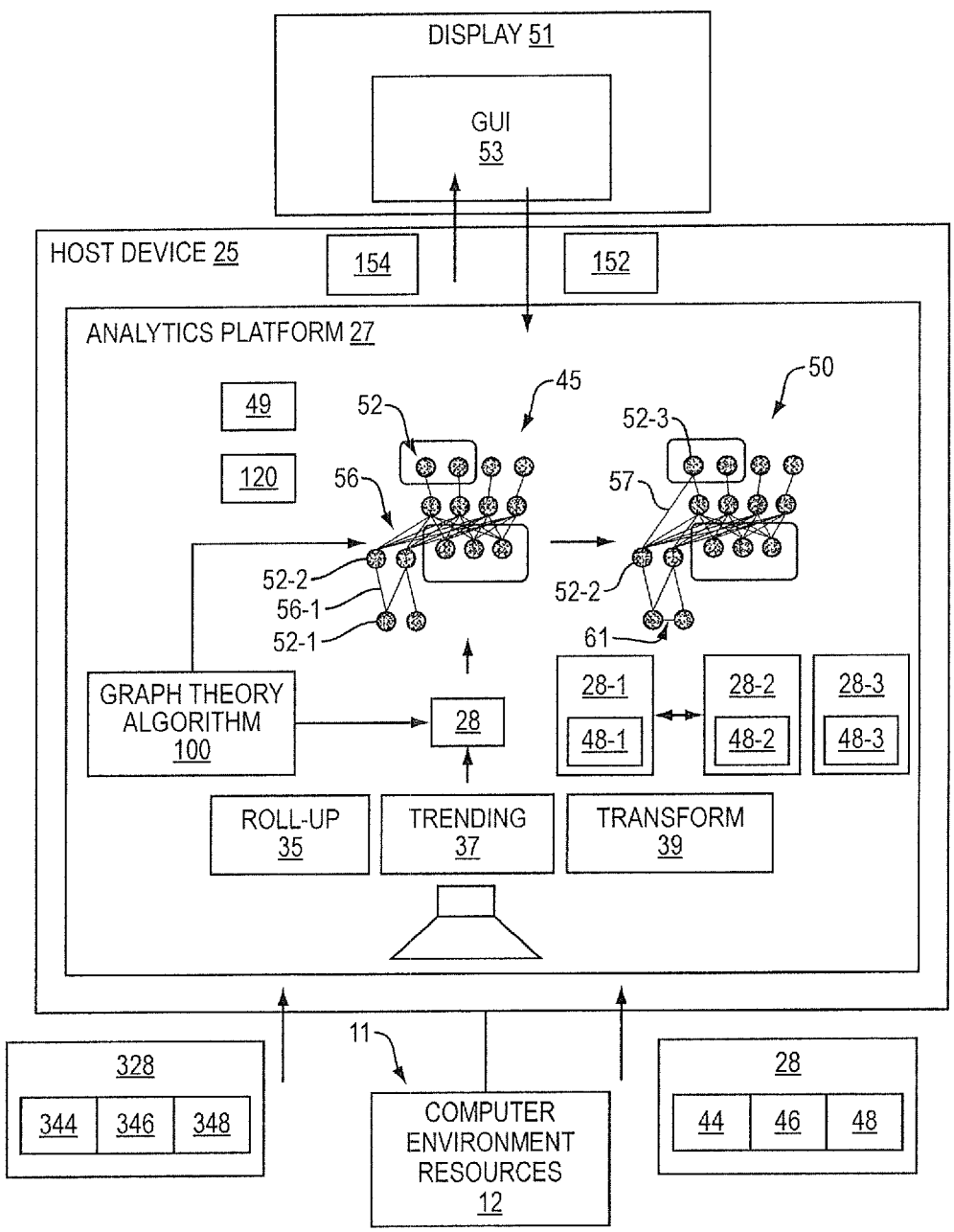
FIG. 4 illustrates a schematic representation of a host device of FIG. 2A processing data elements from a computer infrastructure, according to one arrangement.

During operation, the host device 25 is configured to generate a computer infrastructure model of a computer infrastructure 11 in a number of ways. With reference to FIG. 4, the following description provides an example of the host device 25 processing objects 28 to develop the computer infrastructure model.

Initially, the host device 25 is configured to receive a set of objects from a computer infrastructure 12, each object 28 of the set of objects relating to an attribute of a computer infrastructure resource 12 of the computer infrastructure 11. In one arrangement, during operation, the host device 25 can poll the resources 12 of the computer infrastructure 11 for data relating to the compute level, the network level, the storage level and/or the application or workload level of the computer environment resources 12. In response to the poll, the computer infrastructure 11 provides objects 28 relating to these attributes to the host device 25.

Each object 28 includes an object identifier criterion 44, such as metadata, that identifies a corresponding attribute associated with the object 28. For example, the object identifier criterion 44 can identify events, applications/processes/OS, virtual machines, server devices and their shared primitives like CPU, memory, and network ports, physical and virtual storage components, and network components, such as switches and ports on the switches.

Each object 28 also includes an object relationship criterion 46, such as metadata, that defines one or more explicit relationships among the objects of the set of objects. In one arrangement, the object relationship criterion 46 can originate directly from the attributes (e.g., the interfaces and data structures) provided by the virtualization/cloud provider. For example, the object relationship criterion 46 can identify a particular virtual machine 22 as having a particular, associated workload 23, or as being associated with a particular data store 48. In one arrangement, the object relationship criterion 46 can include connections among the objects 42, such as physical connections (e.g., cable connections between hardware devices) and virtual or software connections among the objects, such as hardware drivers.

Each object 28 also includes an object specific criterion 48 that defines implicit relationships among the objects 28 of the set of objects. The object specific criterion 48 can be configured in a variety of ways. In one arrangement, the object specific criterion 48 is configured as metadata such as iSCSI Qualified Name (IQN) machine metadata. In one arrangement, the object specific criterion 48 is configured as statistical behavior associated with the object 28 (e.g., CPU averages and other performance statistics or query based statistics indicating the speed at which information is returned in response to a query). In one arrangement, the object specific criterion 28 is configured as a predefined, or user-defined, relationship with one or more additional objects associated with the computer infrastructure 11.

Upon receipt, the host device 25 is configured to direct the objects 28 to an analytics platform 27 for processing. The analytics platform 27 can be configured to process the objects 28 in a variety of ways. For example, any number of the computer environment resources 12 can provide the objects 28 to the host device 25 in a proprietary format. In such a case, the analytics platform 27 of the host device 25 is configured to normalize the objects 28 using a normalization or roll-up function 35 such that such that the objects 28 can be presented to an end user. In another example, as the host device 25 receives objects 28 over time, the objects 28 can include varying information regarding the elements of the computer environment resources 12 (e.g., the storage devices 18 or network devices 16). In such a case, the analytics platform 27 of the host device 25 is configured to average the objects 28 using a trending or averaging function 37. In another example, as the host device 25 receives objects 28 over time, the objects 28 can be presented in a variety of formats. For example, for objects 28 received from multiple network devices 16 of the computer infrastructure 11, the speed of the devices 16 can be presented in seconds (s) or milliseconds (ms). In such a case, the analytics platform 27 of the host device 25 is configured to format the objects 28 to a consistent format (e.g., in milliseconds) using a transforming or formatting function 39.

Figure 3A:
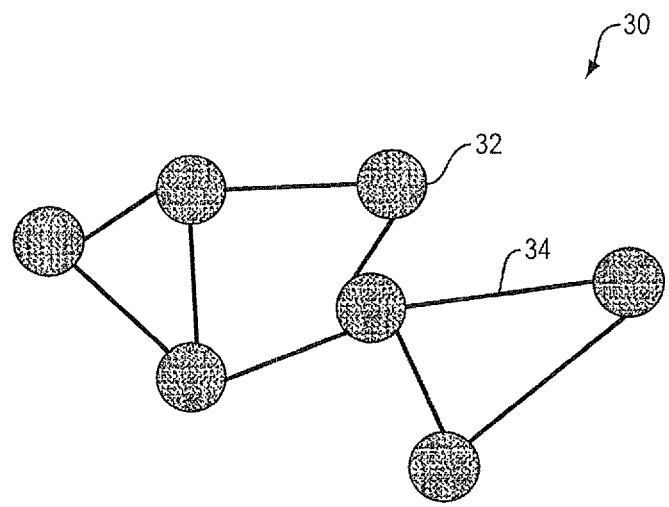
FIG. 3A illustrates an undirected graph, such as generated using graph theory and as provided by a host device, according to one arrangement.
Figure 3B:
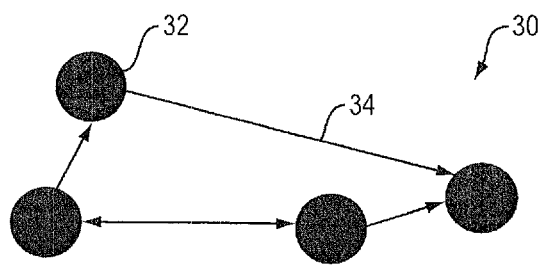
FIG. 3B illustrates a directed graph, such as generated using graph theory and as provided by a host device, according to one arrangement.

Next, with continued reference to FIG. 4, the host device 25 is configured to generate a first computer infrastructure model 45 of the computer infrastructure 11. In one arrangement, the host device 25 is configured to utilize a graph theory function 100 in order to model and derive the complex relationships associated with the objects 28 of the computer infrastructure resources 12. Graph theory relates to the study of graphs which are mathematical structures used to model pairwise relations between objects. With reference to FIGS. 3A and 3B, a graph 30 in this context is made up of vertices or nodes 32 and lines or edges 34 that connect the nodes 32. In one arrangement, a graph 30 can be a directed graph, meaning that the edges 34 are directed from one vertex 32 to another, as illustrated in FIG. 3B. Alternately, as illustrated in FIG. 3A, the graph 30 can be an undirected graph, meaning that there is no distinction in direction between the two vertices 32 associated with each edge 34. Accordingly, the graph 30 is an ordered pair G=(V, E) that includes a set of V vertices or nodes 32 together with a set of E lines or edges 34, which are 2-element subsets of V (i.e., an edge 34 is related with two vertices 32). The relation is represented as an unordered pair of the vertices 32 with respect to the particular edge 34.

Returning to FIG. 4, during operation, the host device 25 is configured to apply a graph theory function 100 to each object 28 to define each object 28 as a node 56 of the computer infrastructure model 45 based upon the respective object identifier criterion 44. Additionally, the host device 25 is configured to apply the graph theory function 100 to each object 28 to define a set of edges 56 among the nodes 56 of the computer infrastructure model 45 based upon the object relationship criterion 46 of each object 28.

During operation, by reviewing the object identifier criterion 44, the host device 25 can identify each object 42 as a particular attribute of the computer infrastructure 11, such as an application attribute, a compute attribute (e.g., a virtual machine (VM) attribute), a storage attribute, and network attributes and can assign each attribute to a node position 52 in the computer infrastructure model 45. For example, assume the case where the object identifier criterion 44 indicates that an object 28 is associated with a storage device 18 within the computer infrastructure 11. Based upon a review of the object identifier criterion 44, the host device 25 can identify the object 28 as being associated with the storage device 18 and can assign the object 28 as a vertex or node 52-1 of the computer infrastructure model 45.

Also during operation, by reviewing the object relationship criterion 46, the host device 25 can identify the explicit relationships among the attributes and can define these relationships as edges 54 in the computer infrastructure model 45. For example, with reference to FIG. 2, assume the case where the object relationship criterion 46 identifies an object 28 associated with the storage device 18 as operating in conjunction with a given data store 48 within the computer infrastructure 11. Based upon a review of the object relationship criterion 46, the host device 25 can identify this explicit relationship and can assign this relationship as an edge 56-1 of the computer infrastructure model 45 between the storage device node 52-1 and a data store node 52-2.

Next, and with reference to FIG. 4, the host device 25 is configured to further define a set of implicit relationships among the nodes 52 of the computer infrastructure model 45 based upon the object specific criterion 48. In one arrangement, the host device 25 is configured to apply the graph theory function 100 to the object specific criterion 48 of each node 52 of the computer infrastructure model 45 to define additional relationships among the objects 28 as a set of edges of the computer infrastructure model.

For example, assume the object specific criterion 48 is configured as IQN machine metadata. With such a configuration, during operation, the host device 25 is configured to review each object 28 of the computer infrastructure model 45 for IQN machine metadata 48. In the case where the host device 25 detects one or more objects 28 that have identical IQN machine metadata 48, the host device 25 can identify an implicit relationship between these objects 28. When applying the graph theory function or algorithm 100 to the implicit relationship provided by the IQN machine metadata 48, the host device 25 can identify this implicit relationship as part of a secondary computer infrastructure model 50. For example, the host device 25 can assign an edge 57 between the nodes 52-2, 52-3 associated with the matching IQN machine metadata 48 to identify the implicit relationship.

In another example, assume the object specific criterion 48 is configured as statistical behavior associated with a given object 28. With such a configuration, during operation, the host device 25 is configured to review each object 28 of the computer infrastructure model 45 for statistical information related to the operation of the corresponding attribute of the computer infrastructure 11. For example, in the case where the objects 28 relate to the VMs 22 of the infrastructure 11, the host device 25 can be configured to review the average VM speed as the statistical behavior 48. In the case where the objects 28 relate to the CPUs 21 of the infrastructure 11, the host device 25 can be configured to analyze the average CPU speed as the statistical behavior 48. In the case where the host device 25 detects one or more objects 28 that have identical or similar statistical behavior 48 (e.g., similar or identical VM speeds, similar or identical CPU utilization, the host device 25 can identify an implicit relationship between these objects 28 leveraging the principals of statistical dependency and classification). When applying the graph theory algorithm 100 to the implicit relationship provided by the statistical behavior 48, the host device 25 can identify this implicit relationship as part of the secondary computer infrastructure model 50. For example, the host device 25 can assign an edge 57 between the nodes 52-2, 52-3 associated with the matching statistical behavior 48 to identify the implicit relationship.

In another example, the object specific criterion 48 can be configured as a pattern of behavior associated with a set of objects 28. With such a configuration, and with continued reference to FIG. 4, the host device 25 is configured to detect the pattern of behavior associated with a first object 28-1 and a second object 28-2. For example, assume the first object 28-1 relates to a first storage device 18-1 of the computer infrastructure 11 and the second object 28-2 relates to a second storage device 18-2 of the computer infrastructure 11. Further assume that the first object 28-1 includes behavior information 48-1 relating to the Input/Output Operations Per Second (IOPs) associated with the first storage device 18-1 and the second object 28-2 includes behavior information 48-2 relating to the IOPs associated with the second storage device 18-2.

As the host device 25 receives the objects 28-1, 28-2, the host device 25 is configured to review the behavior patterns 48-1, 48-2 associated with each. Assume that as the host device 25 examines the IOPs 48-1, 48-2 for each object 28-1, 28-2, the host device 25 identifies similar operating patterns at the same times. For example, in the case where the host device 25 identifies the IOPs of the first and second storage device 18-1, 18-2 as increasing and decreasing at substantially the same time, based upon a review of the behavior information 48-1, 48-2. In such a case, while the first and second storage devices 18-1, 18-2 are not explicitly related, the pattern of behavior as provided by the behavior information 48-1, 48-2 (indicates that there is a shared relationship between first and second storage devices 18-1, 18-2, such as a shared workload). As a result, the host device 25 is configured to define an implicit relationship between the nodes of the computer infrastructure model 50 associated with the first object 28-1 and the second object 28-2 based upon the detected behavior pattern. For example, the host device 25 can assign an edge 61 between the nodes of the computer infrastructure model 50, as associated with the corresponding first and second storage device 18-1, 18-2, to identify the implicit relationship.

In another example, the object behavior criterion 48 can be configured as a predefined object association 48-3. With such a configuration, and with continued reference to FIG. 4, as the host device 25 receives an object, such as object 28-3, from the infrastructure 11, the host device 25 is configured to review the object behavior criterion 48, such as predefined object association 48-3 associated with the object 28-3. For example, assume that the object association 48-3 is configured as metadata, preset by a user or system administrator, which defines an association between first and second storage devices 18-1, 18-2. Based upon a review of the predefined object association 48-3, the host device 25 can assign an edge 61 between the nodes of the computer infrastructure model 50, as associated with the corresponding first and second storage device 18-1, 18-2, to identify the predefined relationship.

By modeling a computer infrastructure using a graph theory function 100 as applied to objects 28 associated with a computer infrastructure 11, a host device 25 is configured to provide a system administrator with the ability to effectively manage the computer infrastructure 11 in the circumstances of normal operations, such as during day-to-day maintenance. For example, as provided above, the host device 25 is configured to develop a computer infrastructure model 50 of the hierarchies and explicit and implicit relationships among objects 28 representing various computer environment resources 12 within the computer infrastructure. Such modeling allows the host device 25 to deliver actionable insights about the computer infrastructure 11 to a system administrator and allows the system administrator to inquire about various aspects of the infrastructure 11 to obtain a greater understanding of the infrastructure's operation.

For example, once the host device 25 has established the computer infrastructure model 50 of the computer infrastructure 11, the host device 25 is configured to allow a system administrator to traverse through the derived set of relationships and associated metadata to address numerous questions that would otherwise be difficult to address in a rapid and efficient manner utilizing canonical tools and/or techniques. Such traversal can be performed using a variety of algorithms (e.g., path finding, depth and breadth first search, spanning tree, etc.) in response to inquiries provided to the host device 25 by the system administrator. With such a traversal, the host device 25 is configured to examine the nodes 52 and edges 56 of the computer infrastructure model 50 (e.g., the metadata connections among the objects 28) to determine relationships of components of infrastructure 11. The following provides a number of example use cases which describe the operation of the host device 25 in this manner.

Availability Analysis—Single Point of Failure

Figure 5:
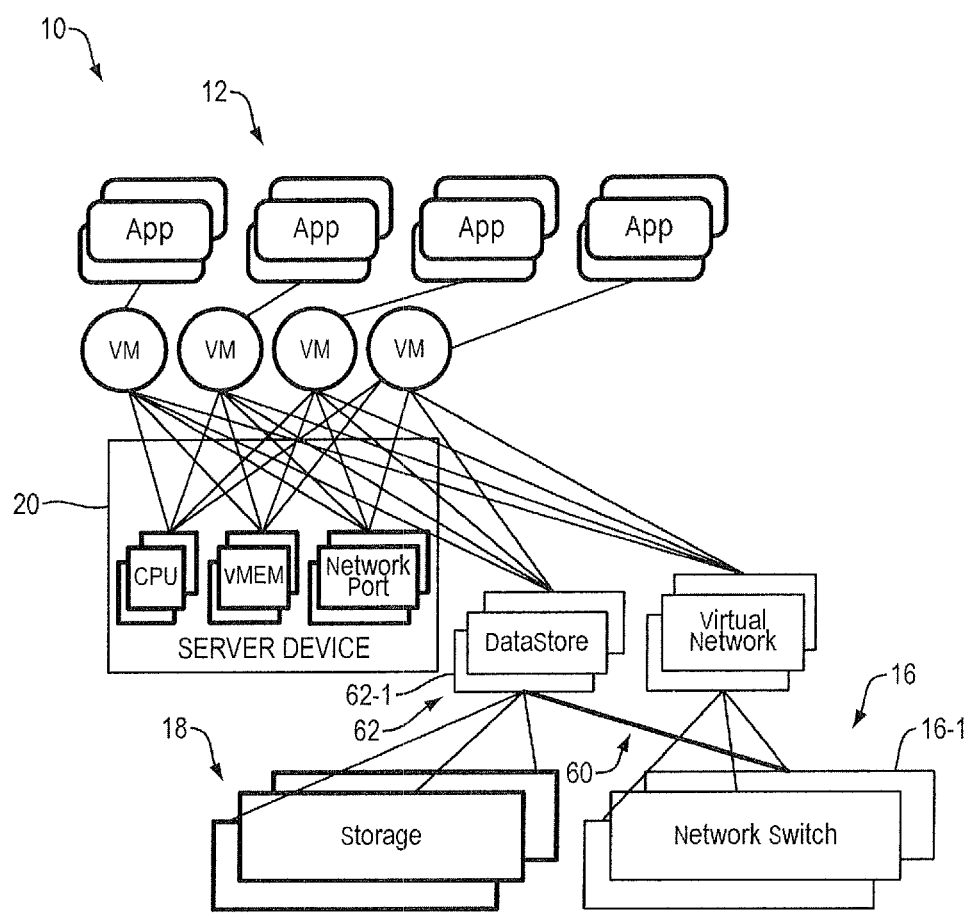
FIG. 5 illustrates a schematic representation of a set of computer infrastructure resources of a computer infrastructure, according to one arrangement.

In one arrangement, the host device 25 is configured to review the computer infrastructure model 50, to detect the presence and absence of redundancies among the computer infrastructure resources 12. For example, FIG. 5 illustrates a schematic representation of a set of computer infrastructure resources 12 of a computer infrastructure 11 as embodied in a computer infrastructure model 50. With reference to FIGS. 4 and 5, initially, the host device 25 receives a point of failure query 152, such as provided by a system administrator. In response to receiving the inquiry 152 from a system administrator, such as via a GUI 53, regarding the presence and absence of redundancies in the infrastructure 10, the host device 25 is configured to detect relationships among a set of infrastructure nodes 52 and infrastructure edges 56 of the computer infrastructure model 11. For example, in response to the request 152, the host device 25 examines all of the relationships among the nodes 52 and edges 56 of the model 50. The host device 25 is further configured to identify redundant relationships and non-redundant relationships among the set of infrastructure nodes 52 and infrastructure edges 56 of the computer infrastructure model 50. For example, based upon an analysis of the computer infrastructure model 50 associated with the schematic representation of the computer infrastructure resources 12 of FIG. 5, the host device 25 can identify a single, non-redundant relationship 60 between the data store 62-1 and the network communication device element 16-1.

Following the identification of a non-redundant relationship within the computer infrastructure model 50, the host device 25 configured to output a non-redundant relationship report 154 in response to the point of failure query 152. For example, with the non-redundant relationship 60 providing a single point of failure within the computer infrastructure 11, the host device 25 is configured to provide the report 154 regarding the non-redundant relationship to the system administrator, such as via the GUI 53.

Availability Analysis—Disaster Recovery Planning

Figure 6:
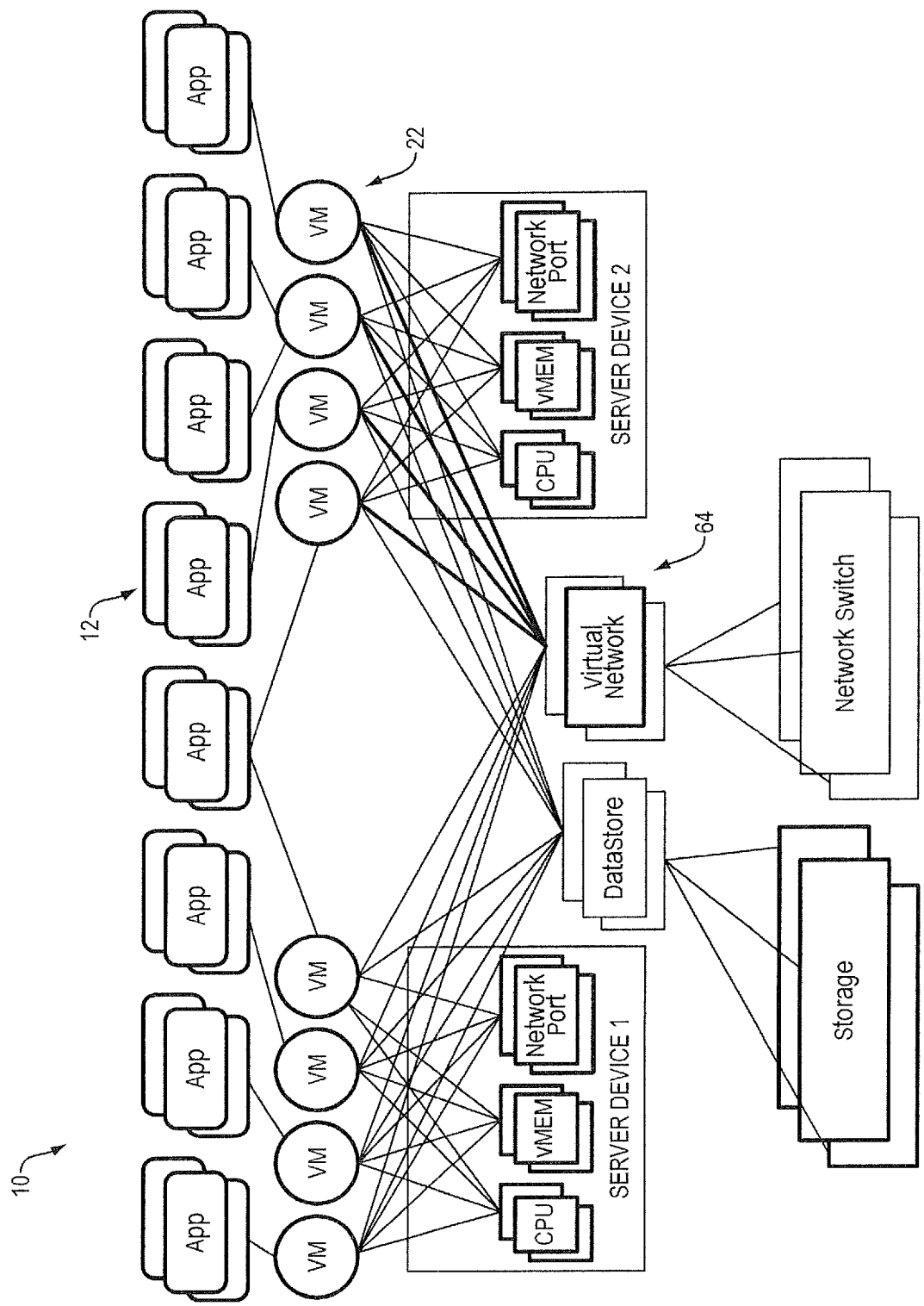
FIG. 6 illustrates a schematic representation of a set of computer infrastructure resources of a computer infrastructure, according to one arrangement.

In one arrangement, the host device 25 is configured to review the computer infrastructure model 50, to determine the portions of the computer infrastructure resources 12 that would be affected by a particular failure. FIG. 6 illustrates a schematic representation of a set of computer infrastructure resources 12 of a computer infrastructure 11 as embodied in a computer infrastructure model 50. With reference to FIGS. 4 and 6, initially, the host device 25 receives a query 152, such as provided by a system administrator via a GUI 53. For example, assume the case where the system administrator provides the inquiry 152 to the host device 25, requesting the identification of the virtual machines 22 that would be affected in the event that a particular virtual network 64 were to fail. In response to receiving the inquiry 152, the host device 25 is configured examine all of the relationships among the nodes 52 of the model 50 to identify the particular virtual machines 22 that would be affected in the case of a disaster/failure of the selected virtual network 64.

Root Cause Analysis

Figure 7:
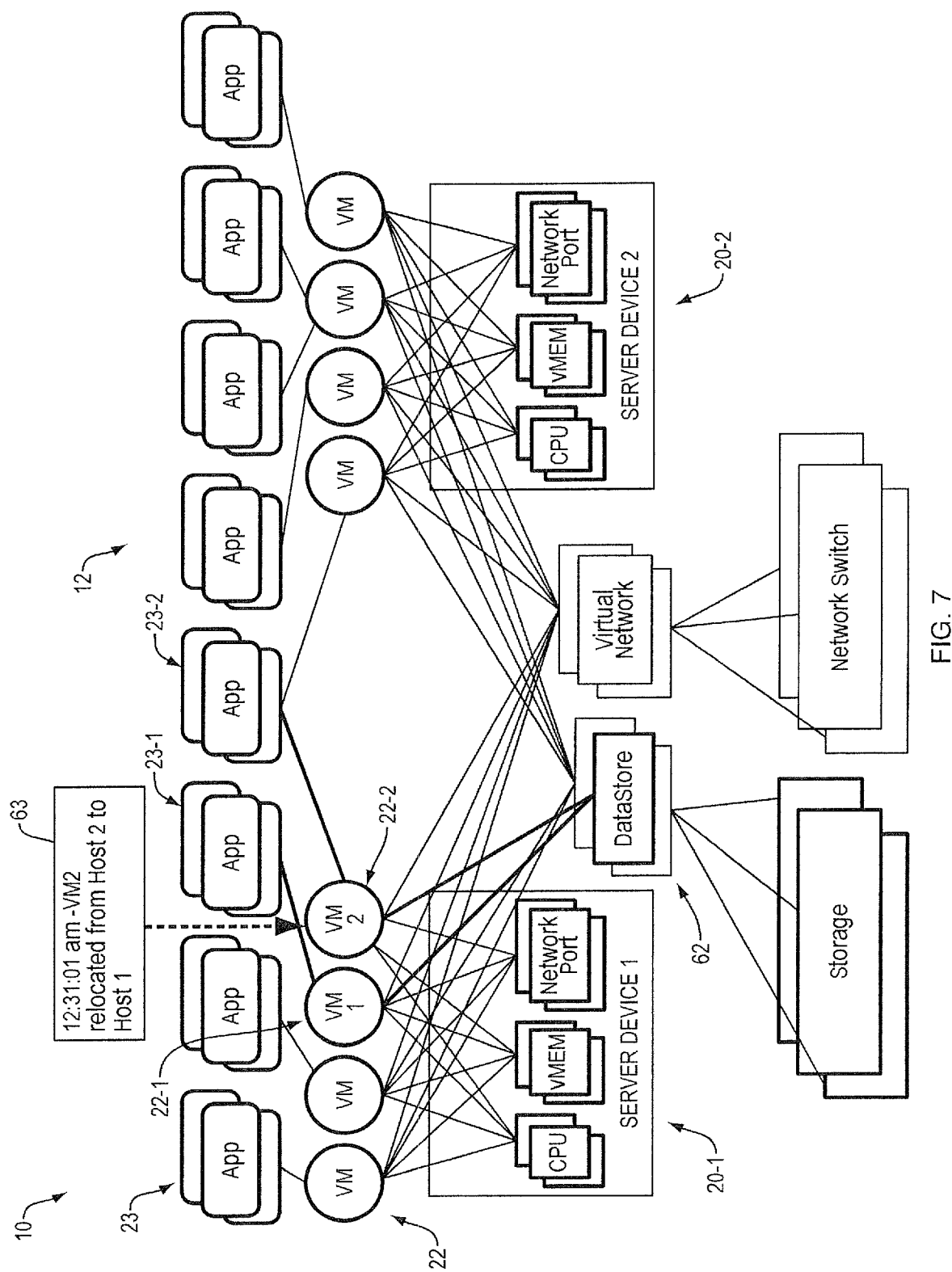
FIG. 7 illustrates a schematic representation of a set of computer infrastructure resources of a computer infrastructure, according to one arrangement.

In one arrangement, the host device 25 is configured to review the computer infrastructure model 50 to detect resource constraints caused by improper provisioning of the environment, failure/disaster, or other events that may cause changes in the computer infrastructure 10. For example, FIG. 7 illustrates a schematic representation of a set of computer infrastructure resources 12 of a computer infrastructure 11 as embodied in a model 50. Assume the case where a system administrator provides an inquiry 152 to the host device 25 to determine the cause of a resource constraint, identified by event message 63, which was introduced by moving a virtual machine 22-2 from a second server device 20-2 to a first server device 20-1. In response to the inquiry, the host device 25 is configured to traverse through all of the relationships among the vertices 52 of the model 50 (e.g., the events and resource) based upon the correlation/relationship of the events to identify the cause and the impact of the issue.

For example, as illustrated in FIG. 7, as the host device 25 traverses through the relationships in the model 50 associated with the computer infrastructure 11, the host device 25 can identify the source of the resource constraint as the data store 62 (e.g., a virtual representation of a LUN on a SAN or locally attached device). Additionally, the host device 25 can identify the impact of the resource constraint by traversing through the model relationships and identifying the affected virtual machines 22-1 and 22-2 and corresponding workloads 23-1, 23-2 by relocation of virtual machine 22-2 from the second server 20-2 to the first server 20-1.

Resource Contention Identification

In one arrangement, the host device 25 is configured to review the computer infrastructure model 50 to detect shared resources, such as network interface, data store, LUN, CPU, memory, etc., that have a relatively abnormally large number of consumers. Such a large number of users can result in the degradation of performance and degradation of service levels. For example, in response to receiving a query 152, the host device 25 is configured to traverse through the model 50 to identify infrastructure attributes utilized by a relatively large number of consumers.

Most Optimal/Available Path

Figure 8:
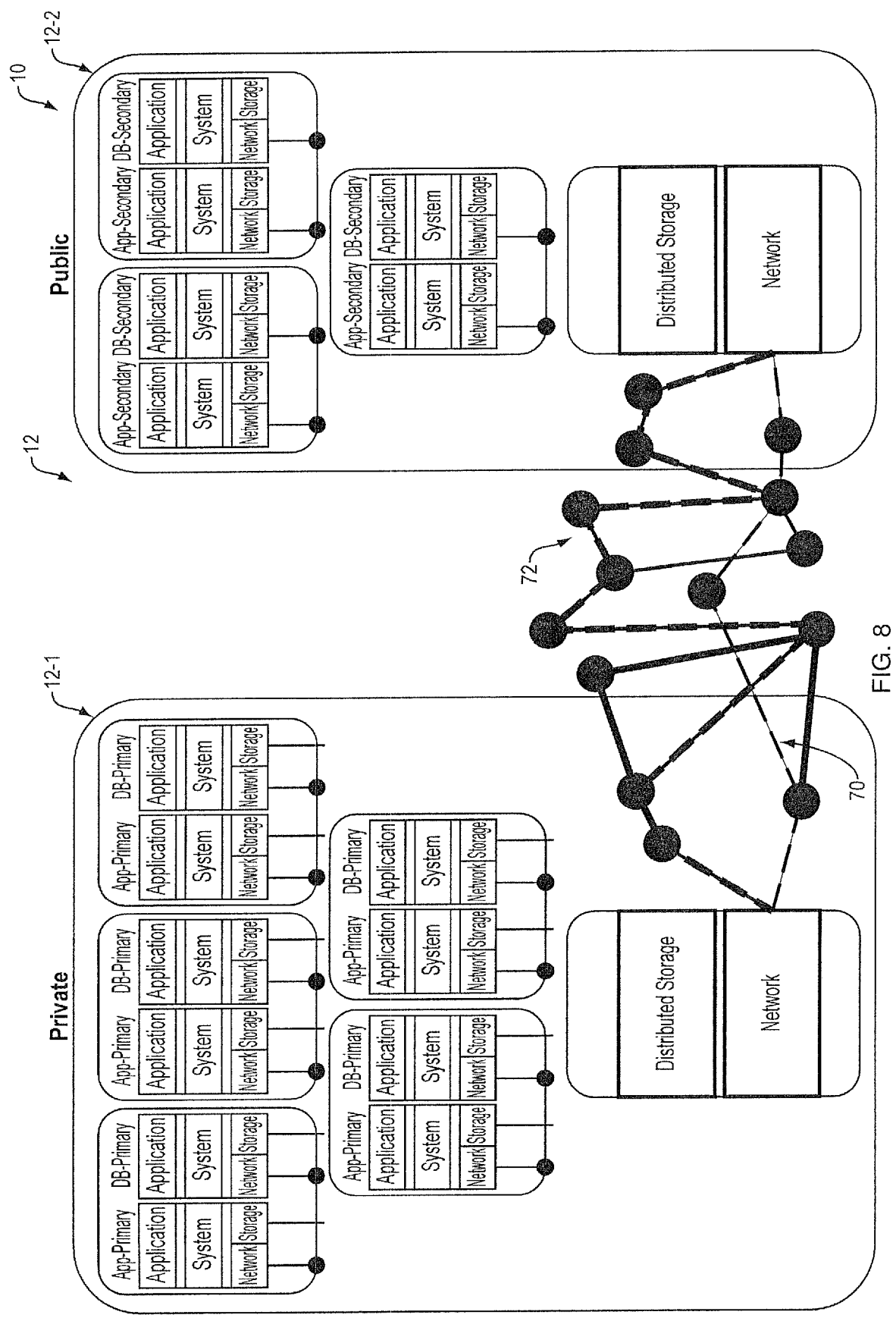
FIG. 8 illustrates a schematic representation of dynamic identification of an optimal path between two networks as provided by a host device, according to one arrangement.

In one arrangement, the host device 25 is configured to review the computer infrastructure model 50 to detect an optimal path among computer infrastructure resources 12 in order to deliver guaranteed service levels (including availability), performance, and security. For example, FIG. 8 illustrates a schematic representation of a set of computer infrastructure resources 12 of a computer infrastructure 11, such as a private set of resources 12-1 and a public set of resources 12-2, as embodied in a computer infrastructure model 50. With reference to FIGS. 4 and 8, initially, the host device 25 receives an optimal path query 152, such as provided by a system administrator via a GUI 53. In response to receiving the inquiry 152, the host device 25 is configured to detect relationships among the set of nodes 52 and infrastructure edges 56 of the computer infrastructure model 50. For example, in response to the request 152, the host device 25 examines or traverses through all of the relationships (i.e., edges 56) among the vertices 52 of the model 50 to dynamically identify an optimal path 70 (i.e., a path that provides a preset or guaranteed level of service, performance, and/or security) between the first and second sets of resources 12-1, 12-2. In one arrangement the host device 25 is further configured to examine or traverses through all of the relationships (i.e., edges 56) among the vertices 52 of the computer infrastructure model 50 to dynamically identify a secondary path 72, which can include an alternative, optimal route between the first and second sets of resources 12-1, 12-2. Alternately, the secondary path 72 can be configured as a bypass path in the event of a failure of a portion to the optimal path 70. For example, the host device 25 can define the secondary path 72 by dynamically/on demand reconfiguring the underlying network infrastructure (e.g., via exposed interfaces like OpenFlow) to guarantee the delivery of the defined service levels (including availability), performance, and security.

Computer Infrastructure Model Update

Over time, the attributes associated with the computer infrastructure 11 can change. For example, the computer infrastructure 11 can experience increase or a decrease in the number of workloads executed or a change in the hardware (e.g., storage devices 18, network devices 16) within the computer infrastructure 11. In one arrangement, the host device 25 is configured to update the computer infrastructure model 50 in real time as the computer infrastructure 11 changes.

For example, with reference to FIG. 4, the host device 25 is configured to receive one or more updated objects 328 from the computer infrastructure 11. The updated object 328 can include an updated object identifier criterion 344, an updated object relationship criterion 346, and an updated object specific criterion 348.

In one arrangement, based upon the receipt of the updated object identifier criterion 344, the host device 25 is configured to update the computer infrastructure model 50. For example, in the case where the object identifier criterion 344 indicates the addition of an attribute (e.g., storage device 18, network device 16, etc.) to the computer infrastructure 11, the host device 25 can add a node 52 to the computer infrastructure model 50. Alternately, in the case where the object identifier criterion 344 indicates the removal of an attribute (e.g., storage device 18, network device 16, etc.) from the computer infrastructure 11, the host device 25 can remove a corresponding node 52 from the computer infrastructure model 50.

In one arrangement, based upon the receipt of the updated object relationship criterion 346, the host device 25 is configured to update the computer infrastructure model 50. For example, in the case where the object relationship criterion 346 indicates the addition of a relationship between attributes (e.g., between a storage device 18 and a network device 16) in the computer infrastructure 11, the host device 25 can add an edge 56 between nodes 52 in the computer infrastructure model 50 which correspond to the attributes. Alternately, in the case where the object relationship criterion 346 indicates a change in the relationship between attributes (e.g., between a storage device 18 and a network device 16) in the computer infrastructure 11, the host device 25 can adjust or remove the corresponding edge 56 between nodes 52 in the computer infrastructure model 50.

In one arrangement, based upon the receipt of the updated object specific criterion 348, the host device 25 is configured to update the computer infrastructure model 50. For example, assume the case where the object specific criterion 348 indicates a change in the metadata (e.g., IQN machine metadata), statistical behavior, or user-defined associations of one or more attributes of the computer infrastructure 11. In such a case, the host device 25 is configured to apply the graph theory function 100 to the object specific criterion 348 of the corresponding nodes 52 of the computer infrastructure model 50 to adjust, add, or delete the implied relationships (i.e., edges) of the computer infrastructure model 50.

Characterization of Objects

As indicated above, and with reference to FIG. 4, the host device 25 is configured to utilize a graph theory function 100 in order to model the complex relationships associated with the objects 28 of the computer infrastructure resources 12. As described, the host device 25 builds the computer infrastructure model 50 based upon implicit relationships among the objects 28, such as provided by the object specific criterion 48 (e.g., metadata) associated with the objects 28. In addition to capturing the relationships between objects (e.g., resources and events associated with the infrastructure), the computer infrastructure model 50 provides the ability to derive non-implicit relationships among the nodes 52 and edges 54.

In one arrangement, the host device 25 is configured to employ, as part of the graph theory function 100, a clustering and classification analysis function or algorithm 120 to the computer infrastructure model 50 to derive and build relationships among the vertices 52 that do not exist implicitly or explicitly. The approach of dynamically building such relationships can employ the clustering techniques of machine learning, as well as through correlation and matching of the metadata associated with vertices 52 and edges 56.

Clustering relates to the task of grouping a set of objects in such a way that objects in the same group, called a cluster, are more similar to each other than to the objects in other groups or clusters. Clustering is a common technique for statistical data analysis, used in many fields, including machine learning, pattern recognition, image analysis, information retrieval, and bioinformatics. The grouping of elements (e.g., objects 28, nodes 52, vertices 56, etc.) into clusters can be achieved by various algorithms that differ significantly in their notion of what constitutes a cluster and how to efficiently find them. For example, known clustering algorithms include hierarchical clustering, centroid-based clustering, distribution based clustering, and density based clustering.

Figure 9:
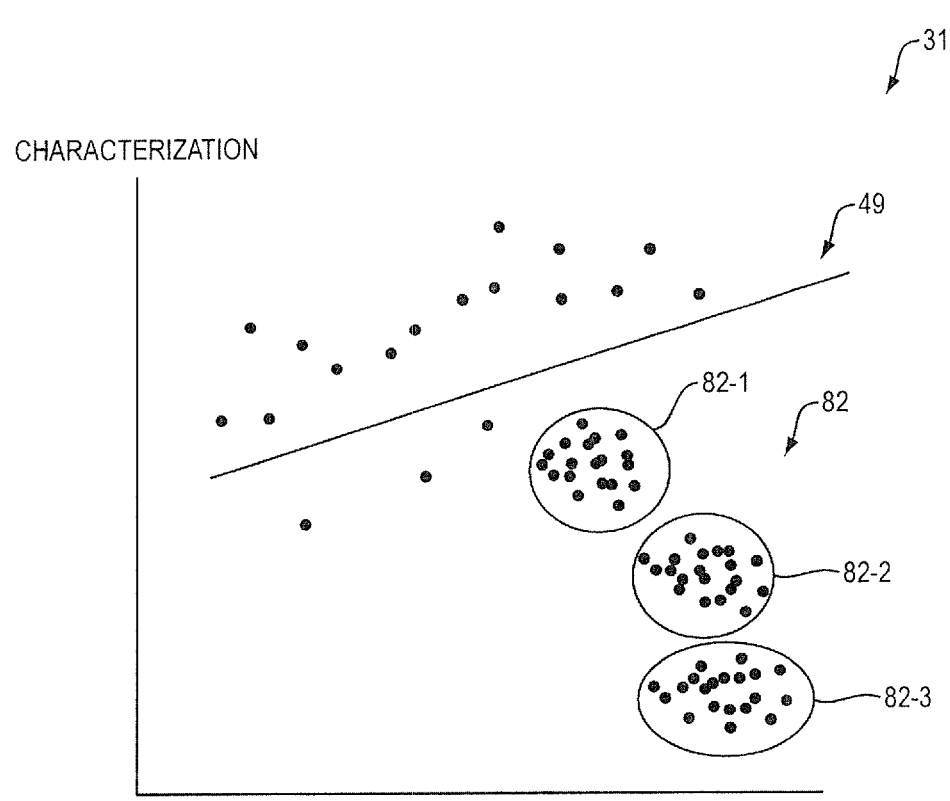
FIG. 9 illustrates clustering of objects as provided by a host device, according to one arrangement.

For example, as part of the clustering process, the analytics platform 27 of the host device 25 is configured to apply a clustering function 120 to each node 52 and each edge 56 of the computer infrastructure model 50 in order to associate particular nodes 52 into groups or clusters. For example, FIG. 9 illustrates the application of the clustering function 45 to computer infrastructure model 50 identify groups nodes 52. As shown in the graph 31, based upon the application of the clustering function 120 to the computer infrastructure model 50, the host device 25 has identified three different clusters 82: a first cluster grouping 82-1, a second cluster grouping 82-2, and a third cluster grouping 82-3. Each cluster 82-1 through 82-3 identifies nodes 52 and edges 56 having some common similarity.

Returning to FIG. 4, by applying the clustering algorithms 120 to the vertices 52 and edges 54 of the computer infrastructure model 50, the host device 25 is configured to classify such as a cluster/group based on certain set of metadata based parameters (e.g., common workload pattern type, common hardware in use, common application type in use, similar IOPs, etc.) or direct/indirect level of connections. Additionally, the host device 25 is configured to monitor incoming objects 28 over time to identify changes in the computer infrastructure 11 and to adjust the clustering of the objects 28 based upon the detected changes.

Further, the host device 25 is configured to apply a linear regression function 49 to each node 52 and each edge 56 of the computer infrastructure model 50. For example, with reference to FIGS. 4 and 9 the analytics platform 27 of the host device 25 is configured to apply the linear regression function 49 to each node 52 and each edge 56 of the computer infrastructure model 50 in order to identify a trend associated with the objects 28 received from the computer infrastructure 11. Additionally, the host device 25 is configured to monitor incoming objects 28 over time to identify changes in the computer infrastructure 11 and to adjust the linear regression based upon the detected changes.

Accordingly, as a result of the application of the clustering function 120 and/or the linear regression function 49, the host device 25 is configured to derive a relationship associated with at least one node 52 of the computer infrastructure model 50. Accordingly, the host device 25 provides the ability for the system administrator (e.g., the virtualization/cloud administrator) to identify and manage relationships among the attributes of the infrastructure 11 that have either not been explicitly identified or have been identified through behavioral analysis (e.g., such as communication, statistical data which identified/specified the behavior, etc.).

The derived relationships among the nodes 52 can be developed in a variety of ways. The following provides example cases relating to the host device 25 utilizing given clustering algorithms 120 to derive relationships among the nodes 52 as related to the attributes of a computer infrastructure 11.

Dynamic Clustering of Resources based on Pattern Recognition

In one arrangement, the host device 25 is configured to dynamically identify the relationships among the objects 28 (i.e., resources) of a computer infrastructure 11 based on certain resource usage or behavior patterns, such as usage of network resources and communication, between the nodes 52. For example, the host device 25 is configured to first identify the edges 54 of the computer infrastructure model 50 based upon the communication among the nodes 52. The host device 25 is configured to then suggest that particular nodes 52 be clustered/grouped 82 based upon identified communication behavior. For example, the host device 25 can identify the presence of communication between certain nodes 52, as well as the type of protocol used, to identify a front-end and a back-end of the communication of an application stack. The host device 25 can capture the probability/accuracy of these relationships (e.g., weighted relationships) as metadata of the edges 54 and can adjust the relationship weighting (e.g., improve, degrade, or completely remove) over time as the host device 25 collects additional data from the infrastructure 10. For example, with reference to FIG. 9, based upon the presence of communication between certain nodes 52, the host device 25 can detect the presence of three separate sets of communication and has assigned the first cluster grouping 82-1, the second cluster grouping 82-2, and the third cluster grouping 82-3 to the nodes 52 accordingly.

Dynamic Clustering of Resources based on Event Correlation

In one arrangement, the host device 25 is configured to apply a clustering function 120 to the nodes 52 of the computer infrastructure model 50 to derive relationships among the nodes 52 based upon metadata correlation and indirect relationships among the nodes 52, as well as sets of events that occur over time. Such identification allows the host device 25 to identify a root cause of a particular issue as well as the objects/resource of the infrastructure 10 that are affected.

Figure 10:
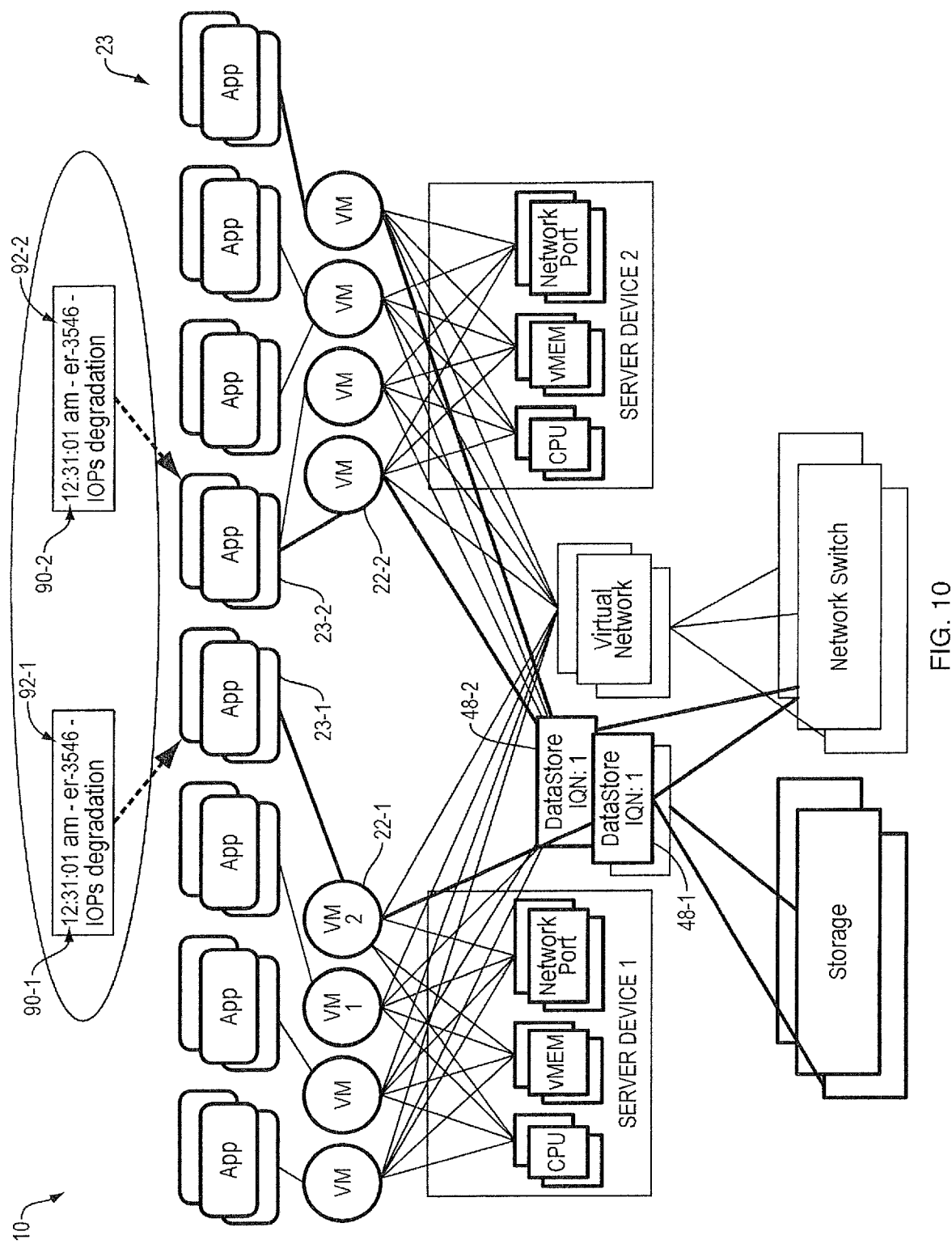
FIG. 10 illustrates a schematic representation of root cause analysis as provided by a host device, according to one arrangement.

For example, with reference to FIG. 10, assume the computer infrastructure 10 experiences a degradation of performance as identified by a host device 25 at the application level 23. In one arrangement, the host device 25 receives a common error code 90-1, 90-1 as associated with separate applications 23-1, 23-2, as well as a time 92-1, 92-2 associated with the corresponding error codes 90-1, 90-2. Accordingly, because the degradation of performance affects two unrelated applications 23-1, 23-2, the host device 25 can detect that the events are related and can establish a relationship between the applications 23-1, 23-2 with a selected weight (e.g., such as with a weight of 3).

Next, the host device 25 is configured to traverse through the computer infrastructure model 50 that represents the computer infrastructure 10 to identify attributes associated with the applications 23-1, 23-2. In the example shown, based on such traversal, the host device 25 identifies two associated, yet distinct, datastores 48-1, 48-2, each of which having the same IQN (iSCSI Qualified Name). Based upon this identification information, the host device 20 can detect a relationship between the datastores 48-1, 48-2 and that there is a common component underneath (i.e., a storage array or LUN) that experiencing performance degradation.

Next, the host device 25 is configured to continue to traverse through the computer infrastructure model 50 to identify additional attributes associated with the performance degradation. For example, the host device 25 can examine other consumers of the datastores 48-1, 48-2, and through the process of traversing through the relationships, identify virtual machines (VMs) 22-1, 22-2 that have a relatively large number of IOPs running with a very high CPU utilization, which causes the performance degradation. Based upon the traversal, the host device 25 can identify the VMs are running the backups, which lead to the degradation of services of the VMs that were leveraging the same shared resources (i.e. datastores 48-1, 48-2). After identifying the cause, the host device 25 adjusts the weight of the identified earlier relationships, which can be used at later time if similar issues were to occur.

Dynamic Clustering of Resources and Integration with External Sources

In one arrangement, the host device 25 is configured to integrate, correlate, and cluster objects based on the input from external (to the current deployment) sources. For example, the host device 25 can integrate data from different hardware or cloud provider vendors to identify a variety of issues.

In one example, based on clustering of the resources, the host device 25 can determine that a sub-graph that represents a set of workloads is best to be implemented on certain types of hardware architectures. Based on this, the host device 25 can determine which hardware vendors deliver such architecture, and out of ones that do, which ones are more cost efficient.

For example, the host device 25 can first derive the sub-graph (cluster) of resources that similar based on their behavior, such as similar workload, and identify the hardware architecture where such being delivered efficiently in terms of performance and cost. Next, the host device 25 can obtain the information from the available vendor interfaces with respect to suitable hardware architectures and corresponding prices. Based on the above information, the consumer of this data can automatically/programmatically or manually make the decision on purchasing, etc.

In another example, based on clustering of the resources a sub-graph, the host device 25 is configured to identify a certain (e.g., common) workload which is a combination of the application, compute, network, and storage level resources with corresponding statistical data that specifies the behavior. Once such is identified through the cloud/virtualization provider interfaces it is possible to (i) identify the set of providers (and include such as part of the graph) that are capable to satisfy the requirements of the workload along with specified service levels, etc. and (ii) identify the subset of such providers that are capable to deliver such in a cost efficient manner that at later time automatically/programmatically or manually certain set of actions can take place to move/migrate the workload to the best suited set of providers.

While various embodiments of the innovation have been particularly shown and described, it will be understood by those skilled in the art that various changes in form and details may be made therein without departing from the spirit and scope of the innovation as defined by the appended claims.

What is claimed is:

1. In a host device, a method for generating a computer infrastructure model of a computer infrastructure, comprising:

receiving, by the host device, a set of objects from the computer infrastructure, each object of the set of objects relating to an attribute of a computer infrastructure resource of the computer infrastructure and each object of the set of objects having an object identifier criterion, an object relationship criterion, and an object specific criterion;

applying, by the host device, a graph theory function to the set of objects to define each object as a node of the computer infrastructure model based upon the respective object identifier criterion;

applying, by the host device, the graph theory function to the set of objects to define a set of explicit relationships among the set of objects as a first set of edges among the nodes of the computer infrastructure model based upon the object relationship criterion of each object, each edge of the first set of edges configured as an explicit relationship between two objects of the set of objects of the computer infrastructure model;

applying, by the host device, the graph theory function to the set of objects to define a set of implicit relationships among the set of objects as a second set of edges among the nodes of the computer infrastructure model based upon the object specific criterion of each object, the object specific criterion of each object being one of statistical behavior associated with each object of the set of objects and related to the operation of the corresponding attribute of the computer infrastructure resource and behavior information associated with at least a first object and a second object of the set of objects, wherein the behavior information comprises a shared relationship between the first object and the second object at a time, each edge of the second set of edges configured as an implicit relationship between two objects of the set of objects of the computer infrastructure model;

applying, by the host device, as part of the graph theory function, a clustering function to each node and each edge to statistically classify relationships among the objects of the computer infrastructure model;

receiving, by the host device, a query regarding the computer infrastructure via a graphical user interface;

traversing, by the host device, the computer infrastructure model based upon the query; and outputting, by the host device, a report regarding the computer infrastructure via the graphical user interface based upon the traversal of the computer infrastructure model;

wherein applying the clustering function to each node and each edge of the computer infrastructure model comprises applying, by the host device, as part of the graph theory function, the clustering function to each node and each edge based upon a detected interaction behavior pattern between nodes to statistically classify relationships among the objects of the computer infrastructure model.

2. The method of claim 1, comprising:

receiving, by the host device, at least one of an updated object identifier criterion, an updated object relationship criterion, and an updated object specific criterion associated with an updated object of the set of objects of the computer infrastructure;

in response to receiving the updated object identifier criterion, redefining, by the host device, the computer infrastructure model based upon the updated object identifier criterion;

in response to receiving the updated object relationship criterion, redefining, by the host device, the computer infrastructure model based upon the updated object relationship criterion of the updated object; and in response to receiving the updated object specific criterion, redefining, by the host device, the computer infrastructure model based upon the updated object specific criterion of the updated object.

3. The method of claim 1, comprising:
applying, by the host device, a linear regression function to each node and each edge of the computer infrastructure model; and
deriving, by the host device, a relationship associated with at least one node of the computer infrastructure model of the computer infrastructure model based upon a result of the application of the linear regression function to each node and each edge of the computer infrastructure model.

4. The method of claim 1, wherein applying the clustering function to each node and each edge of the computer infrastructure model comprises applying, by the host device, a clustering function to each node and each edge of the computer infrastructure model based upon a detected event associated with the nodes of the computer infrastructure model.

5. The method of claim 1, wherein:
receiving the query regarding the computer infrastructure via the graphical user interface comprises receiving, by the host device, a point of failure query;
traversing the computer infrastructure model based upon the query comprises:
detecting, by the host device, relationships among a set of infrastructure nodes and infrastructure edges of the computer infrastructure model in response to the point of failure query, and
identifying, by the host device, redundant relationships and non-redundant relationships among the set of infrastructure nodes and infrastructure edges of the computer infrastructure model; and
outputting the report regarding the computer infrastructure via the graphical user interface based upon the traversal of the computer infrastructure model comprises outputting, by the host device, a non-redundant relationship report in response to the point of failure query.

6. The method of claim 1, wherein:
receiving the query regarding the computer infrastructure via a graphical user interface comprises receiving, by the host device, an optimal path query; and
traversing the computer infrastructure model based upon the query comprises detecting, by the host device, relationships among the set of nodes and edges of the computer infrastructure model in response to the optimal path query.

7. The method of claim 1, wherein the statistical behavior associated with each object of the set of objects comprises one of a virtual machine speed of each object of the set of objects and a processor utilization of each object of the set of objects.

8. The method of claim 1, wherein the behavior information comprises one of increasing Input/Output Operations Per Second (IOPs) occurring between the first object and the second object at a time and decreasing IOPs occurring between the first object and the second object at a time.

9. A host device, comprising:
a controller having a memory and a processor, the controller configured to: receive a set of objects from a computer infrastructure, each object of the set of objects relating to an attribute of a computer infrastructure resource of the computer infrastructure and each object of the set of objects having an object identifier criterion, an object relationship criterion, and an object specific criterion;
apply a graph theory function to the set of objects to define each object as a node of the computer infrastructure model based upon the respective object identifier criterion;
apply the graph theory function to the set of objects to define a set of explicit relationships among the set of objects as a first set of edges among the nodes of the computer infrastructure model based upon the object relationship criterion of each object, each edge of the first set of edges configured as an explicit relationship between two objects of the set of objects;
apply the graph theory function to the set of objects to define a set of implicit relationships among the set of objects as a second set of edges among the nodes of the computer infrastructure model based upon the object specific criterion of each object, the object specific criterion of each object being one of statistical behavior associated with each object of the set of objects and related to the operation of the corresponding attribute of the computer infrastructure resource and behavior information associated with at least a first object and a second object of the set of objects, wherein the behavior information comprises a shared relationship between the first object and the second object at a time, each edge of the second set of edges configured as an implicit relationship between two objects of the set of objects;
apply, as part of the graph theory function, a clustering function to each node and each edge to statistically classify relationships among the objects of the computer infrastructure model;
receive a query regarding the computer infrastructure via a graphical user interface;
traverse the computer infrastructure model based upon the query; and output a report regarding the computer infrastructure via the graphical user interface based upon the traversal of the computer infrastructure model;
wherein when applying the clustering function to each node and each edge of the computer infrastructure model, the controller is configured to apply, as part of the graph theory function, the clustering function to each node and each edge based upon a detected interaction behavior pattern between nodes to statistically classify relationships among the objects of the computer infrastructure model.

10. The host device of claim 9, wherein the controller is configured to:
receive at least one of an updated object identifier criterion, an updated object relationship criterion, and an updated object specific criterion associated with an updated object of the set of objects of the computer infrastructure;
in response to receiving the updated object identifier criterion the controller is configured to redefine the computer infrastructure model based upon the updated object identifier criterion;
in response to receiving the updated object relationship criterion, the controller is configured to redefine the computer infrastructure model based upon the updated object relationship criterion of the updated object; and
in response to receiving the updated object specific criterion, the controller is configured to redefine the computer infrastructure model based upon the updated object specific criterion of the updated object.

11. The host device of claim 9, wherein the controller is configured to:
apply a linear regression function to each node and each edge of the computer infrastructure model; and
derive a relationship associated with at least one node of the computer infrastructure model based upon a result of the application of the linear regression function to each node and each edge of the computer infrastructure model.

12. The host device of claim 9, wherein when applying the clustering function to each node and each edge of the computer infrastructure model, the controller is configured to apply a clustering function to each node and each edge of the computer infrastructure model based upon a detected event associated with the nodes of the computer infrastructure model.

13. The host device of claim 9, wherein the controller is configured to:
when receiving the query regarding the computer infrastructure via the graphical user interface, receive a point of failure query;
when traversing the computer infrastructure model based upon the query:
detect relationships among a set of infrastructure nodes and infrastructure edges of the computer infrastructure model in response to the point of failure query, and
identify redundant relationships and non-redundant relationships among the set of infrastructure nodes and infrastructure edges of the computer infrastructure model; and
when outputting a report regarding the computer infrastructure via the graphical user interface based upon the traversal of the computer infrastructure model, output a non-redundant relationship report in response to the point of failure query.

14. The host device of claim 9, wherein the controller is configured to:
when receiving the query regarding the computer infrastructure via the graphical user interface, receive an optimal path query; and
when traversing the computer infrastructure model based upon the query, detect relationships among the set of nodes and edges of the computer infrastructure model in response to the optimal path query.

15. The host device of claim 9, wherein the statistical behavior associated with each object of the set of objects comprises one of a virtual machine speed of each object of the set of objects and a processor utilization of each object of the set of objects.

16. The host device of claim 9, wherein the behavior information comprises one of increasing Input/Output Operations Per Second (IOPs) occurring between the first object and the second object at a time and decreasing IOPs occurring between the first object and the second object at a time.

17. A computer program product having a non-transitory computer-readable medium including computer program logic encoded thereon that, when performed on a controller of a host device causes the host device to:
receive a set of objects from a computer infrastructure, each object of the set of objects relating to an attribute of a computer infrastructure resource of the computer infrastructure and each object of the set of objects having an object identifier criterion, an object relationship criterion, and an object specific criterion;
apply a graph theory function to the set of objects to define each object as a node of the computer infrastructure model based upon the respective object identifier criterion;
apply the graph theory function to the set of objects to define a set of explicit relationships among the set of objects as a first set of edges among the nodes of the computer infrastructure model based upon the object relationship criterion of each object, each edge of the first set of edges configured as an explicit relationship between two objects of the set of objects;
apply the graph theory function to the set of objects to define a set of implicit relationships among the set of objects as a second set of edges among the nodes of the computer infrastructure model based upon the object specific criterion of each object, the object specific criterion of each object being one of statistical behavior associated with each object of the set of objects and related to the operation of the corresponding attribute of the computer infrastructure resource and behavior information associated with at least a first object and a second object of the set of objects, wherein the behavior information comprises a shared relationship between the first object and the second object at a time, each edge of the second set of edges configured as an implicit relationship between two objects of the set of objects;
apply, as part of the graph theory function, a clustering function to each node and each edge to statistically classify relationships among the objects of the computer infrastructure model;
receive a query regarding the computer infrastructure via a graphical user interface;
traversing the computer infrastructure model based upon the query; and output a report regarding the computer infrastructure via the graphical user interface based upon the traversal of the computer infrastructure model;
wherein when applying the clustering function to each node and each edge of the computer infrastructure model, apply, as part of the graph theory function, the clustering function to each node and each edge based upon a detected interaction behavior pattern between nodes to statistically classify relationships among the objects of the computer infrastructure model.

* * * * *